(12) United States Patent
Pettersson

(10) Patent No.: US 10,876,307 B2
(45) Date of Patent: Dec. 29, 2020

(54) CONSTRUCTION MANAGEMENT SYSTEM AND METHOD

(71) Applicant: HEXAGON TECHNOLOGY CENTER GMBH, Heerbrugg (CH)

(72) Inventor: Bo Pettersson, Luxembourg (LU)

(73) Assignee: HEXAGON TECHNOLOGY CENTER GMBH, Heerbrugg (CH)

( * ) Notice: Subject to any disclaimer, the term of this patent is extended or adjusted under 35 U.S.C. 154(b) by 367 days.

(21) Appl. No.: 15/875,986

(22) Filed: Jan. 19, 2018

(65) Prior Publication Data

US 2018/0209156 A1 Jul. 26, 2018

(30) Foreign Application Priority Data

Jan. 20, 2017 (EP) .................................... 17152513

(51) Int. Cl.
| | |
|---|---|
| *E04G 21/16* | (2006.01) |
| *G05B 17/02* | (2006.01) |
| *G01B 21/04* | (2006.01) |
| *G01B 11/00* | (2006.01) |
| *G09B 25/04* | (2006.01) |
| *E04B 1/35* | (2006.01) |
| *B66C 13/48* | (2006.01) |

(Continued)

(52) U.S. Cl.
CPC .............. *E04G 21/16* (2013.01); *B66C 13/48* (2013.01); *E04B 1/35* (2013.01); *G01B 11/005* (2013.01); *G01B 11/285* (2013.01); *G01B 21/04* (2013.01); *G05B 17/02* (2013.01); *G06Q 10/06313* (2013.01); *G06Q 50/08* (2013.01); *G09B 25/04* (2013.01); *G06F 30/13* (2020.01)

(58) Field of Classification Search
None
See application file for complete search history.

(56) References Cited

U.S. PATENT DOCUMENTS

| | | |
|---|---|---|
| 5,696,673 A | 12/1997 | Pryor |
| 7,395,606 B2 | 7/2008 | Crampton |

(Continued)

FOREIGN PATENT DOCUMENTS

| | | |
|---|---|---|
| CN | 103886139 A | 6/2014 |
| EP | 2 108 917 A1 | 10/2009 |

(Continued)

OTHER PUBLICATIONS

Extended EP Search Report dated Jun. 29, 2017 as received in Application No. 17152513.2.

*Primary Examiner* — Peter D Nolan
*Assistant Examiner* — Demetra R Smith-Stewart
(74) *Attorney, Agent, or Firm* — Maschoff Brennan

(57) ABSTRACT

A construction management system for constructing a building including at least one heavy lifting machine for moving a one building element to a mounting position on the building, a central computing unit providing a building information model comprising at least a construction plan comprising a target state of the construction of the building, a three-dimensional model of an actual construction state of the building, and a three-dimensional model of the element, wherein the central computing unit is adapted to determine the mounting position for the element based on the construction plan, the model of the current construction state and on the model of the element.

15 Claims, 9 Drawing Sheets

(51) Int. Cl.
    *G06Q 10/06*     (2012.01)
    *G06Q 50/08*     (2012.01)
    *G01B 11/28*     (2006.01)
    *G06F 30/13*     (2020.01)

(56) References Cited

U.S. PATENT DOCUMENTS

| | | |
|---|---|---|
| 8,099,877 B2 | 1/2012 | Champ |
| 2013/0096873 A1* | 4/2013 | Rosengaus ............ G01C 15/002 |
| | | 702/151 |
| 2014/0192159 A1 | 7/2014 | Chen et al. |
| 2014/0268064 A1 | 9/2014 | Kahle et al. |
| 2014/0365259 A1 | 12/2014 | Delplace et al. |
| 2015/0285913 A1 | 10/2015 | Becker et al. |
| 2016/0031680 A1* | 2/2016 | Delplace ................ B66C 13/46 |
| | | 703/7 |
| 2016/0033258 A1 | 2/2016 | Böckem et al. |
| 2016/0063709 A1* | 3/2016 | Booij .................... H04N 7/183 |
| | | 348/142 |
| 2016/0224927 A1* | 8/2016 | Pettersson ............ G06Q 10/067 |
| 2017/0122736 A1* | 5/2017 | Dold .................... G01C 15/006 |

FOREIGN PATENT DOCUMENTS

| | | |
|---|---|---|
| EP | 2 629 210 A1 | 8/2013 |
| EP | 2 980 526 A1 | 2/2016 |
| JP | 5489310 B1 | 5/2014 |
| WO | 2014/056825 A1 | 4/2014 |

\* cited by examiner

CONSTRUCTION MANAGEMENT SYSTEM AND METHOD

CROSS-REFERENCE TO RELATED APPLICATIONS

This application claims priority to European Patent Application No. 17152513 filed on Jan. 20, 2017. The foregoing patent application are incorporated herein by reference.

FIELD OF INVENTION

The present invention pertains to a construction management system for a building site of a structure and to a method for moving a building element to a mounting position of a building by means of a crane or other heavy lifting machine, wherein the mounting position is determined using a building information model (BIM), and during the craning of the building element a position and orientation of the element is determined in real time and in six degrees of freedom.

BACKGROUND

In the art of general construction work such as building construction and civil engineering, planning, progress observation, documentation, appropriate accounting are important key factors. In many instances, those aspects are getting more and more complex and dynamic, in particular due to the many parties involved, fluctuating human and/or objective resources, increased complexity of the end results, tighter schedules, increased costs of human resources, etc. Work that was formerly planed and overseen by a single manager is nowadays too complex for a single person and dividing the work among more persons often leads to errors at the interfaces of the work fields.

Therefore, it has been tried to expand automation and computerization in this technical field. For example, in the art of building construction, documents EP 2 629 210, JP 5489310, CN 103886139, US 2014/268064 and US 2014/192159 give examples of so-called BIM-system approaches.

In the art of constructing buildings or other large structures it is also known to measure the building during the construction, as deviations from the planned layout are a frequent problem. From WO 2014/056825 A1 it is further known that new elements that are to be mounted to the building can be measured before or are after shipping to the building site e.g. in order to determine the best fitting mounting position of the element in view of determined deviations.

BRIEF DESCRIPTION

It is therefore an object of some embodiments of the present invention to provide an improved construction management system for a building site of a structure. It is another object of some embodiments to provide an improved method for positioning a building element at a mounting position of a building by means of a crane.

It is a particular object of some embodiments to provide such a system and method that allow a faster positioning and thus mounting of the building element.

It is a further object of some embodiments to provide such a system and method that allow mounting the building element with higher precision.

Another object of some embodiments of the present invention is to provide such a system and method that allow mounting the building element with smaller workforce.

At least one of these objects is achieved by the construction management system according to claim 1, the method according to claim 10 and/or the dependent claims of the present invention.

A first aspect of one embodiment of the present invention relates to a construction management system for the construction of a building wherein at least one heavy lifting machine, e.g. a crane, is used for moving at least one building element to a mounting position on the building, the system comprising a central computing unit with calculation means and a data storage, the central computing unit providing a building information model comprising at least a construction plan comprising a target state of the construction of the building, a three-dimensional model of an actual construction state of the building, and a three-dimensional model of the element, wherein the central computing unit is adapted to determine the mounting position for the element based on the construction plan, on the model of the current construction state and on the model of the element.

Preferably, said mounting position is the best-fitting mounting position and particularly also comprises a mounting orientation. The element can be unique or one of a multitude of basically identical items.

According to this aspect of the invention, the construction management system comprises a machine controlling unit and a pose determining unit. Said machine controlling unit is adapted to generate movement information to allow moving the element to the mounting position by means of the lifting machine. Said pose determining unit (e.g. comprising a laser tracker) is adapted to determine, in real time and in six degrees of freedom (6dof), a position and orientation of the element while it is lifted by means of the lifting machine, e.g. craned by means of the crane, to generate pose data based on the determined position and orientation of the element, and to provide the pose data to the machine controlling unit in real time, wherein the machine controlling unit is adapted to generate the movement information in real time based on the pose data.

Instead of only determining a mounting position, optionally a mounting pose (also comprising a mounting orientation) can be determined in six degrees of freedom. In one embodiment of the construction management system, the central computing unit is adapted to determine a mounting pose of the element based on the construction plan, on the model of the current construction state and on the model of the element, the mounting pose comprising the mounting position and a mounting orientation. The movement information particularly comprises information about a position of the element relative to the mounting position and an orientation of the element relative to the mounting orientation.

The pose determining unit in one embodiment of the system comprises at least one articulated arm coordinate measuring machine (CMM) that is adapted to determine, at the mounting position, a position of the element relative to the mounting position and an orientation of the element relative to the mounting orientation. The CMM can be positioned at or near the mounting position, depending on a range of the articulated arm. Alternatively, it can be provided on the element itself or on a part of the lifting machine, in case of a crane e.g. a crane gear. Such articulated arm CMMs are known in the art and disclosed for instance in the documents EP 2 108 917 A1, U.S. Pat. No. 7,395,606 B2 and U.S. Pat. No. 8,099,877 B2.

The articulated arm can be connectable with a first end to a defined point of the building and with a second end to a defined point of the element.

According to another embodiment, the central computing unit is adapted to determine a movement path from a determined position of the element to the mounting position, and the movement information comprises movement instructions for moving the element along the movement path. The machine controlling unit is adapted to automatically control the lifting machine based on the movement instructions, and/or comprises a display and is adapted to visually provide the movement instructions to an operator of the lifting machine.

The lifting machine for instance can be a crane, e.g. a mobile crane or tower crane, a forklift truck, or a manned or unmanned aerial vehicle (UAV), such as a helicopter or an airship.

In a particular embodiment, the crane controlling unit is adapted to provide the movement instructions to a field device comprising a display and being adapted to visually provide the movement instructions to said user.

According to another embodiment of the construction management system, the machine controlling unit is adapted to provide the movement information to a user a user who is situated at or near the mounting position. Said user optionally can be an operator of the lifting machine, operating the lifting machine from the mounting position, e.g. by means of a remote control. The machine controlling unit can also be adapted to provide the movement information to a field device comprising a display and being adapted to visually provide the movement information to the user. In a particular embodiment, said field device can be a remote control for the lifting machine.

In one embodiment, the construction management system comprises survey instruments that are adapted to determine the 3D model of the actual construction state of the building, and/or the 3D model of the element. The survey instruments for instance can be laser scanners.

According to another embodiment, the pose determining unit comprises at least one movable GNSS (Global Navigation Satellite System) device attachable to the element and/or to a crane gear to which the element is fixed during craning, in particular at least two movable GNSS devices, providing first GNSS data indicating a position of the element. The GNSS devices particularly comprise a GNSS antenna.

According to one embodiment, the pose determining unit comprises at least one stationary GNSS device, in particular at least two stationary GNSS devices, providing stationary GNSS data, and is adapted to determine at least the position of the element based on the first GNSS data and on the stationary GNSS data.

According to another embodiment of the construction management system, the pose determining unit comprises at least one surveying device, in particular at least two surveying devices, being adapted to determine, in three positional degrees of freedom, a position of a retroreflector that is attached to the element and/or to a first part (e.g. a crane gear) of the lifting machine to which the element is fixed during lifting, providing surveying data indicating a position and orientation of the element, particularly wherein the at least one surveying device is a laser tracker adapted to track the retroreflector.

According to one embodiment, the at least one surveying device has camera means, adapted to continuously capture images of a measuring aid comprising features that are arranged and identifiable in the image of the cameras to allow determining an orientation in three rotational degrees of freedom. In particular, the retroreflector is part of the measuring aid.

Such a laser tracker that is adapted to track a retroreflector while determining a distance to said retroreflector and has a camera for determining an orientation of a measuring aid is disclosed e.g. in EP 2 980 526 A1.

In a further embodiment, the at least one surveying device has a surveying area in which the position and orientation of the element is determinable, wherein the method comprises moving the element into the surveying area. In particular, the surveying area is determined based on the three-dimensional model of the current construction state of the building, and/or a position of the element is determined by means of a GNSS device when the element is not in the surveying area.

According to another embodiment of the system, the central computing unit is adapted to predict dimensional changes of the element and/or of fittings for connecting the element to the building, said dimensional changes occurring before mounting the element, e.g. during the movement of the element, or after mounting the element, and to consider these changes when determining the mounting position.

According to another embodiment of the system, the pose determining unit is adapted to monitor a distance of the element to the mounting position and to determine the position and orientation of the element in 6dof only when the distance is below pre-defined a threshold value, said threshold value e.g. also depending on the size of the element.

Alternatively or additionally, the pose determining unit can be adapted to determine the position (and orientation) of the element with increasing accuracy as the element approaches the mounting position, i.e. with a lower precision or iteration rate if the element is still far away from the mounting position than if it is nearly there.

According to another embodiment of the system, the pose determining unit comprises at least one surveying device and at least one GNSS device, wherein the at least one surveying device has a three-dimensional surveying area in which the position and orientation of the element is determinable (i.e. the position and orientation of the element are not determinable outside said surveying area).

The GNSS device is then adapted to determine the position of the element, even if it is outside of the surveying area. The central computing unit is adapted to determine the surveying area (or its borders, respectively) at least based on the model of the current construction state, wherein the method comprises moving the element into the surveying area, and the machine controlling unit is adapted to generate movement information to allow moving the element into the surveying area by means of the lifting machine.

Another embodiment of the present invention relates to a method for positioning a building element at a mounting position of a building by means of a heavy lifting machine, e.g. a crane, particularly using a construction management system according to the first aspect.

The method comprises providing a building information model comprising at least a construction plan comprising a target state of the construction of the building, a three-dimensional model of a current construction state of the building, and a three-dimensional model of the element. The method further comprises determining the mounting position for the element based on the construction plan, on the model of the current construction state and on the model of the element, and lifting the element by means of the lifting machine, e.g. craning the element by means of the crane.

According to some embodiments of the invention, the method further comprises determining, in real time and in six degrees of freedom, a position and orientation (pose) of the element while being lifted, generating pose data based on the determined position and orientation of the element, generating movement information in real time based on the pose data, and moving, by means of the lifting machine, the element to the mounting position according to the movement information.

According to one embodiment of the construction management system, providing the three-dimensional model of the element comprises measuring the element, in particular by means of a laser scanner.

According to another embodiment of the construction management system, providing the three-dimensional model of the current construction state of the building comprises measuring the building, in particular by means of a laser scanner.

In one embodiment, determining the mounting position comprises predicting dimensional changes of the element and/or of fittings for connecting the element to the building, said changes occurring during moving the element and/or after mounting the element.

In another embodiment, the position and orientation of the element is determined with increasing accuracy as the element approaches the mounting position.

In yet another embodiment, determining the position and orientation of the element comprises determining by means of at least one surveying device, in particular at least two surveying devices, a position of a retroreflector that is attached to the element and/or to a first element of the lifting machine to which the element is fixed during lifting (e.g. to a crane gear of a crane to which the element is fixed during craning), particularly wherein the retroreflector is tracked by the at least one surveying device.

According to a further embodiment of the method, a distance of the element to the mounting position is monitored, wherein the position and orientation of the element is determined in six degrees of freedom only when the distance is below a threshold value. Alternatively or additionally, the position and orientation of the element is determined with increasing accuracy as the element approaches the mounting position.

In one embodiment, the at least one surveying device has a surveying area in which the position and orientation of the element is determinable, and the method comprises moving the element into the surveying area.

Said surveying area can be determined based on the three-dimensional model of the current construction state of the building, and a position of the element can be determined by means of a GNSS device when the element is not in the surveying area.

Another aspect of some embodiments of the invention relates to a computer programme product comprising programme code which is stored on a machine-readable medium, or being embodied by an electromagnetic wave comprising a programme code segment, and having computer-executable instructions for performing, in particular when run on calculation means of a construction management system according to the first aspect of the invention, at least the following steps of the method according to the second aspect of the invention:

determining, in real time and in six degrees of freedom, a position and orientation (pose) of the element while being lifted, generating pose data based on the determined position and orientation of the element, and generating movement information in real time based on the pose data that allow moving the element to the mounting position.

BRIEF SUMMARY OF THE DRAWINGS

The invention in the following will be described in detail by referring to exemplary embodiments that are accompanied by figures, in which.

DETAILED DESCRIPTION

Figure 1A:
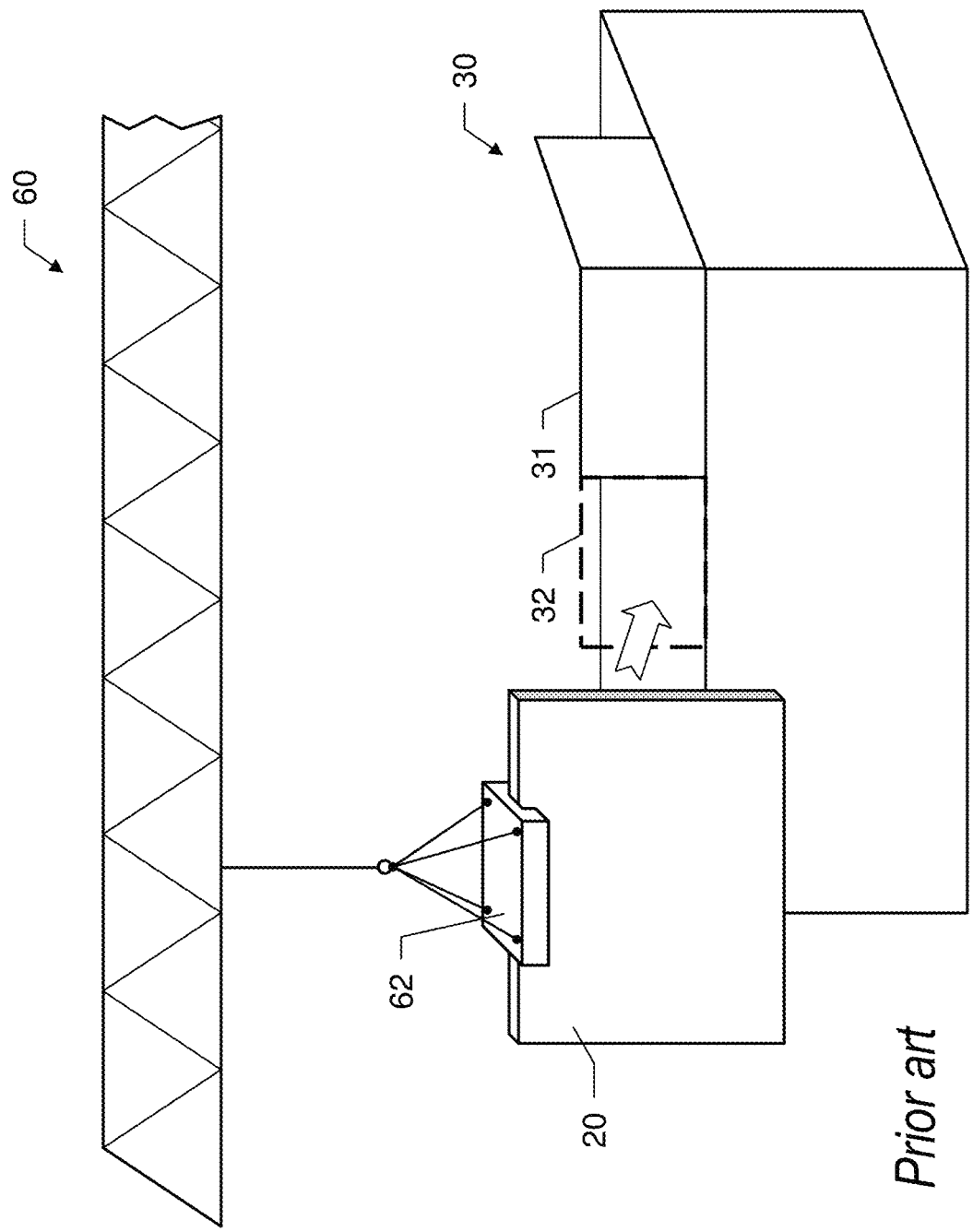
FIGS. 1a-b show a building site with a construction of a building and a wall element that is to be positioned on the building by means of a crane.
Figure 1B:
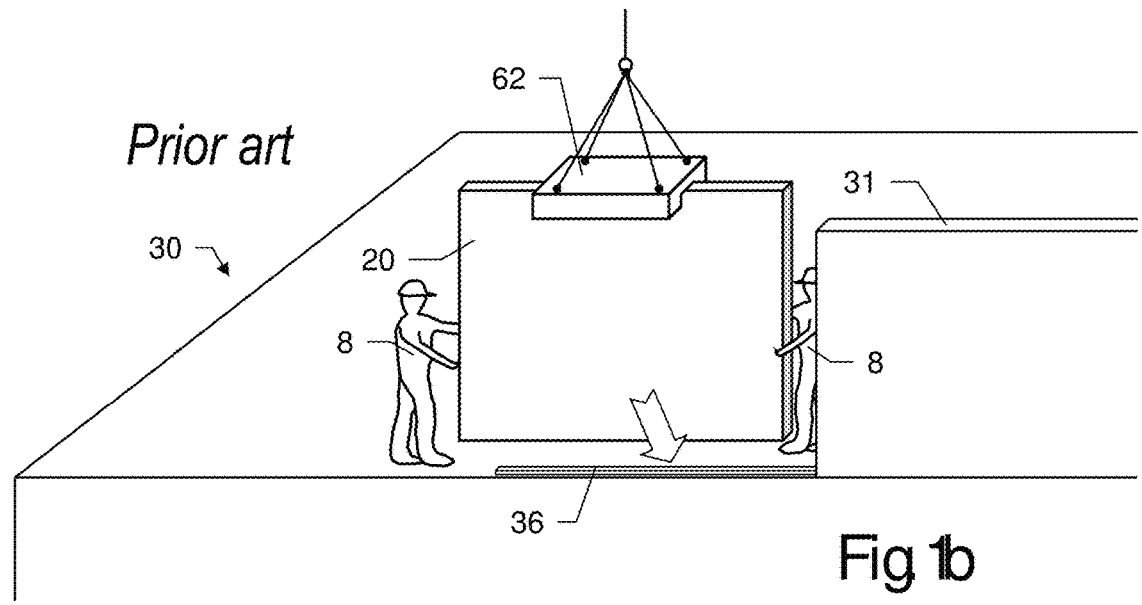

In FIGS. 1a and 1b a building site is shown, as it is generally known in the art. The building site comprises a building 30 that is under construction and a wall element 20 that is to be positioned on the building 30 by means of a crane 60. Instead of a building, the construction can of course also be or comprise infrastructure such as roads or railways.

As shown in FIG. 1a, for craning, the element 20 can be fixed to a gear 62 of the crane 60. It is then moved by the crane 60 which is operated by a crane operator (not shown) towards a mounting position 32 on the building 30 to be mounted e.g. next to an already existing wall element 31. In FIG. 1b, the element 20 has arrived at the building 30 near the mounting position. Two construction workers 8 move the element 20 manually to the mounting position in order to mount it next to the already existing wall element 31 and on fixings 36 of the building 30.

Figure 2:
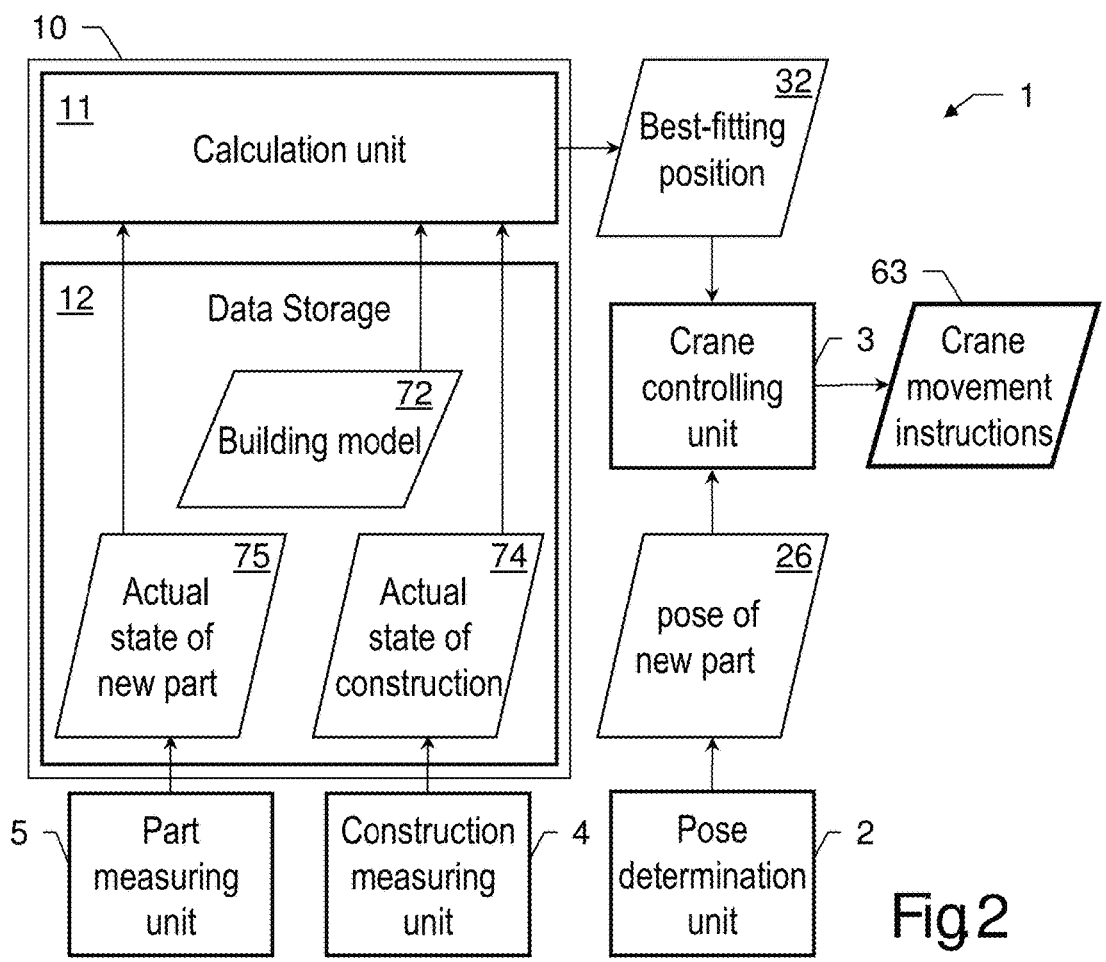
FIG. 2 illustrates an exemplary embodiment of a construction management system according to the invention.

In FIG. 2 an exemplary embodiment of a construction management system 1 according to the invention is depicted.

The system 1 comprises a computer system 10 with calculation means 11 and a data storage 12. The system furthermore comprises a pose determination unit 2 and a crane controlling unit 3. In the shown example, the system 1 also comprises a construction measuring unit 4 and a part measuring unit 5. The computer system 10 can optionally be adapted as a cluster of servers, a cloud or similar means.

The construction measuring unit 4 and the part measuring unit 5 are adapted to measure a construction (e.g. the building 30 of FIG. 1a) and a new part (e.g. the wall element 20 of FIG. 1a), and to generate measurement data describing an actual state of the construction 74 and an actual state of the new part 75, respectively. These as-built data sets 74, 75 and a building model 72 (e.g. a construction plan comprising a target state of the construction of the building) are stored as parts of a building information model in the data storage 12. The data storage 12 is adapted to provide the data, i.e. the building model 72, the actual state of the construction 74 and the actual state of the new part 75 to the calculation unit 11 which comprises programme code having computer-executable instructions for calculating based on the provided data 72, 74, 75 a mounting position 32 for the new part on the construction, in particular the best-fitting mounting position 32. The computer system 10 is adapted to provide the determined mounting position 32 to the crane controlling unit 3.

Determining the mounting position 32 is performed by virtual fitting and preferably also comprises determining a mounting orientation of the element at the mounting position 32, i.e. a mounting pose is determined in six degrees of freedom.

If there are more than one new parts available for mounting, determining the mounting position 32 may also comprise determining a sequence in which the parts are to be mounted.

The pose determination unit 2 is adapted to determine a pose 26 of the new part, i.e. its position and orientation in six degrees of freedom, while the part is being craned by means of the crane. Pose data comprising information about the determined pose 26 is generated and provided to the crane controlling unit 3 in real time.

The crane controlling unit 3 is adapted to use the mounting position 32 provided by the computer system 10 and the pose data provided by the pose determination unit 2 in real time to generate movement instructions 63 for the crane. The movement instructions 63 may comprise an optimal movement path for the new part to the mounting position 32.

The crane controlling unit 3 is preferably provided at the crane. It may comprise a display and be adapted to visually provide the movement instructions 63 to an operator of the crane, or be adapted to automatically control the crane based on the movement instructions 63. If the crane is operated by an operator not located in the crane 60 (e.g. the operator controlling the crane from the mounting position), the crane controlling unit 3 can also be adapted as a handheld device or provide the movement instructions 63 to a handheld device.

Instead of a crane, of course also other heavy lifting machines can be used that are adapted to position a building element at a mounting position. Such heavy lifting machines comprise forklift trucks as well as manned or unmanned aerial vehicles, such as helicopters or airships.

In the FIGS. 3 to 7, exemplary embodiments of a pose determining unit of a construction management system according to the invention are shown, the pose determining units determining the pose of the wall element shown in FIGS. 1a and 1b in six degrees of freedom by means of a GNSS system or by means of at least one surveying device.

Figure 3:
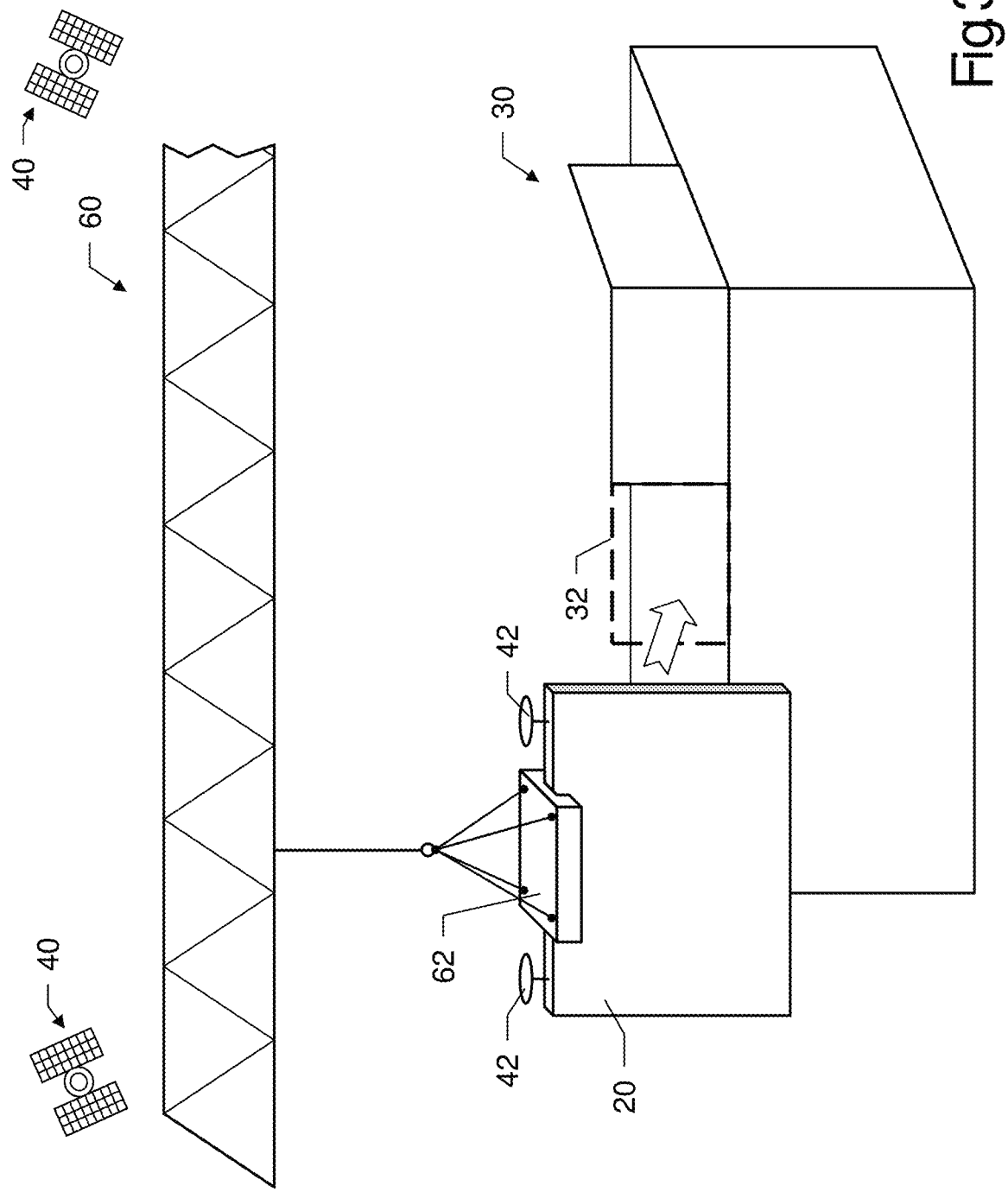
FIGS. 3-5 show three exemplary embodiment of a pose determining unit of a construction management system according to the invention for determining the pose of the wall element of FIGS. 1a-b in six degrees of freedom by means of a GNSS system.

FIG. 3 shows the situation of FIG. 1a, wherein a pose determining unit is provided for determining the pose of the wall element 20 while it is suspended from the crane 60 and moved towards the mounting position 32 on the building 30. The pose determining unit comprises two GNSS antennas 42 each of which being adapted to work with a global navigation satellite system (GNSS, represented by satellites 40), such as e.g. GPS, for determining a position of the GNSS antenna 42. In this embodiment, the GNSS antennae 42 are placed directly on the element 20 to allow determining a position and orientation of the element 20. The pose determining unit comprises a calculation unit (not shown) which receives position data from the GNSS antennas 42 in real time, indicating the positions of the GNSS antennas 42 in a global coordinate system and calculates a pose of the element 20. Pose data is then transmitted to a crane controlling unit for controlling the crane 60.

Figure 4:
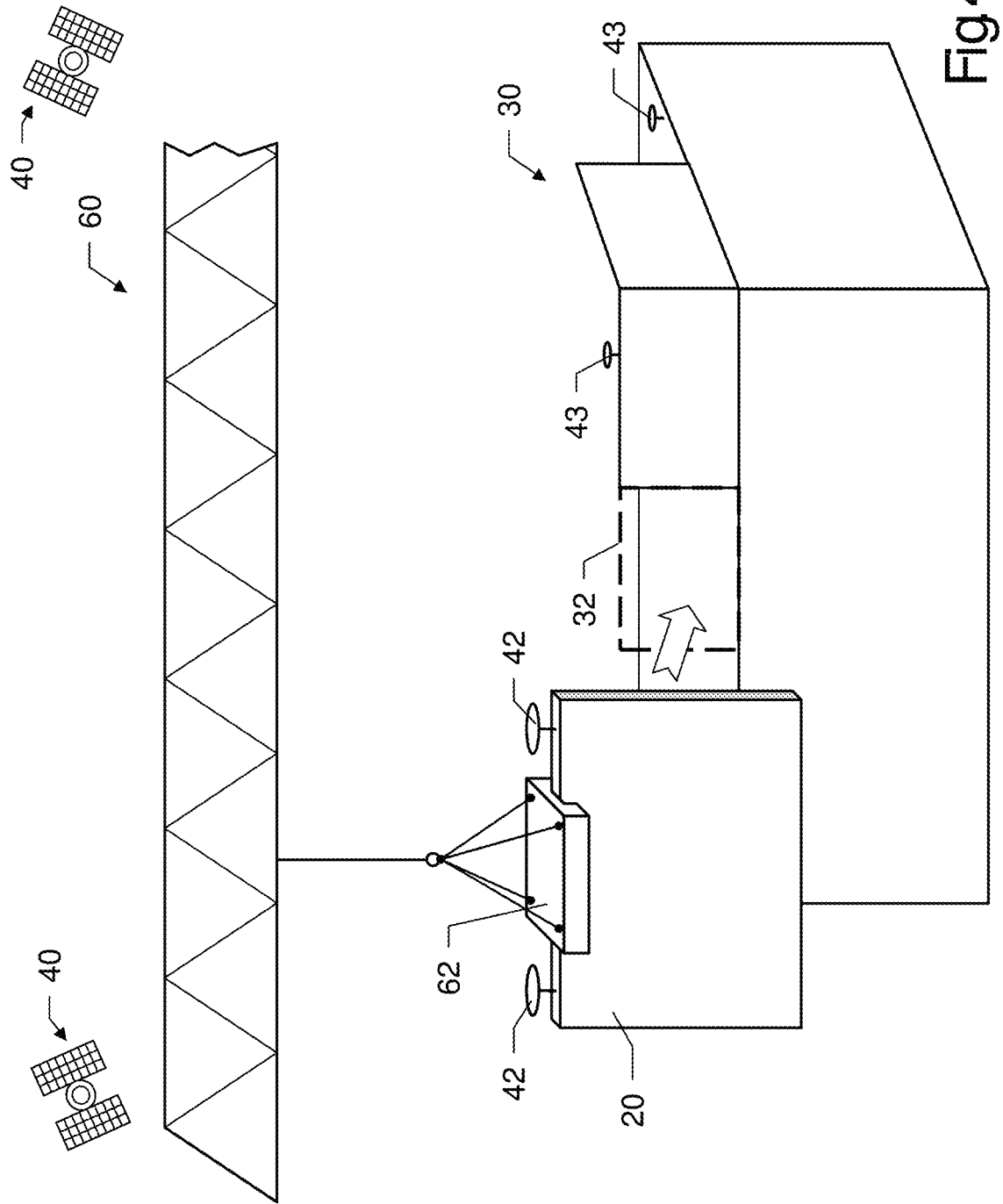

In the embodiment of FIG. 4, the pose determining unit furthermore comprises fixed GNSS antennas 43 that are placed on the building 30. The calculation unit receives position data also from these fixed GNSS antennas 43 in real time, and is adapted to compare the position data with that from the movable GNSS antennas 42 on the element 20. This allows determining a movement of the element 20 with higher precision than in a configuration in which only the positions of the movable GNSS antennas 42 is determined.

Figure 5:
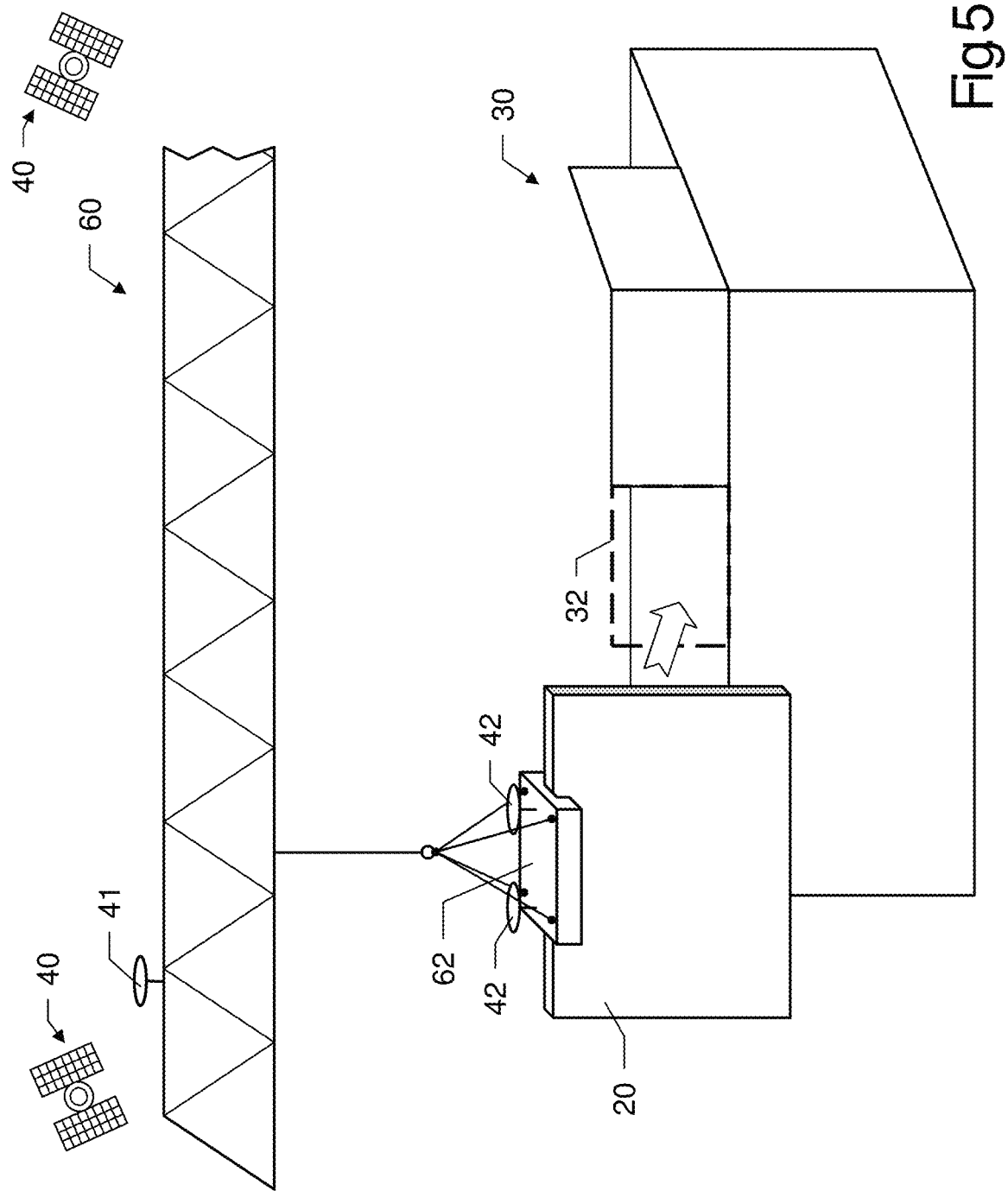

In the embodiment of FIG. 5, the pose determining unit comprises additional GNSS antennas 41 that are placed on the crane 60, e.g. on the crane boom (as shown here) and on a crane tower (not shown). Additionally, the movable GNSS antennas 42 are installed on the crane gear 62 instead of being connected directly to the craned element 20.

Figure 6:
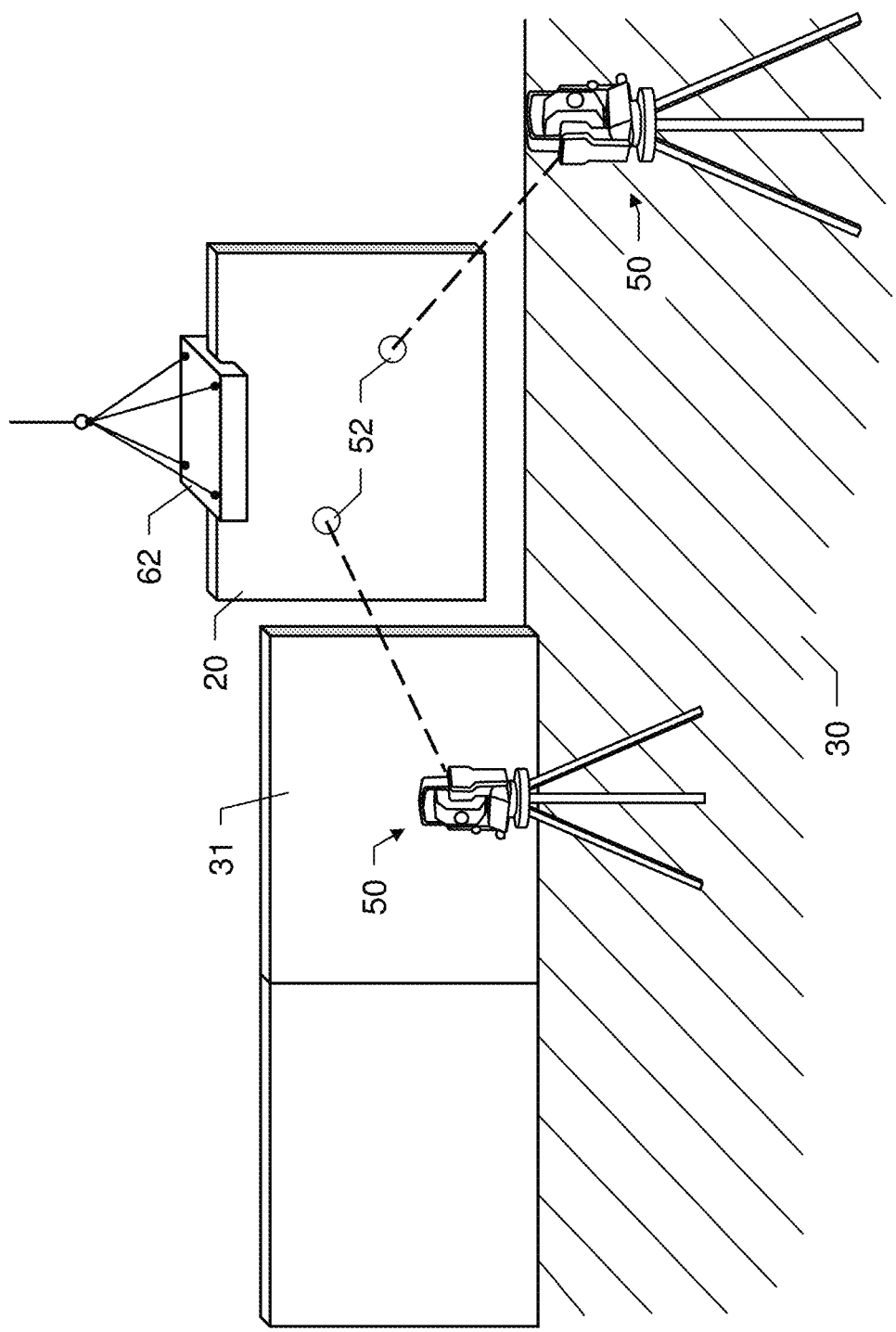
FIGS. 6-7 show two exemplary embodiment of a pose determining unit of a construction management system according to the invention for determining the pose of the wall element of FIGS. 1a-b in six degrees of freedom by means of surveying devices.

FIG. 6 shows another embodiment of the pose determining unit comprising two surveying devices 50. These can be adapted as theodolites and measure distances and angles to retroreflectors 52 that are provided on the element 20 or the gear 62 at known positions.

Figure 7:
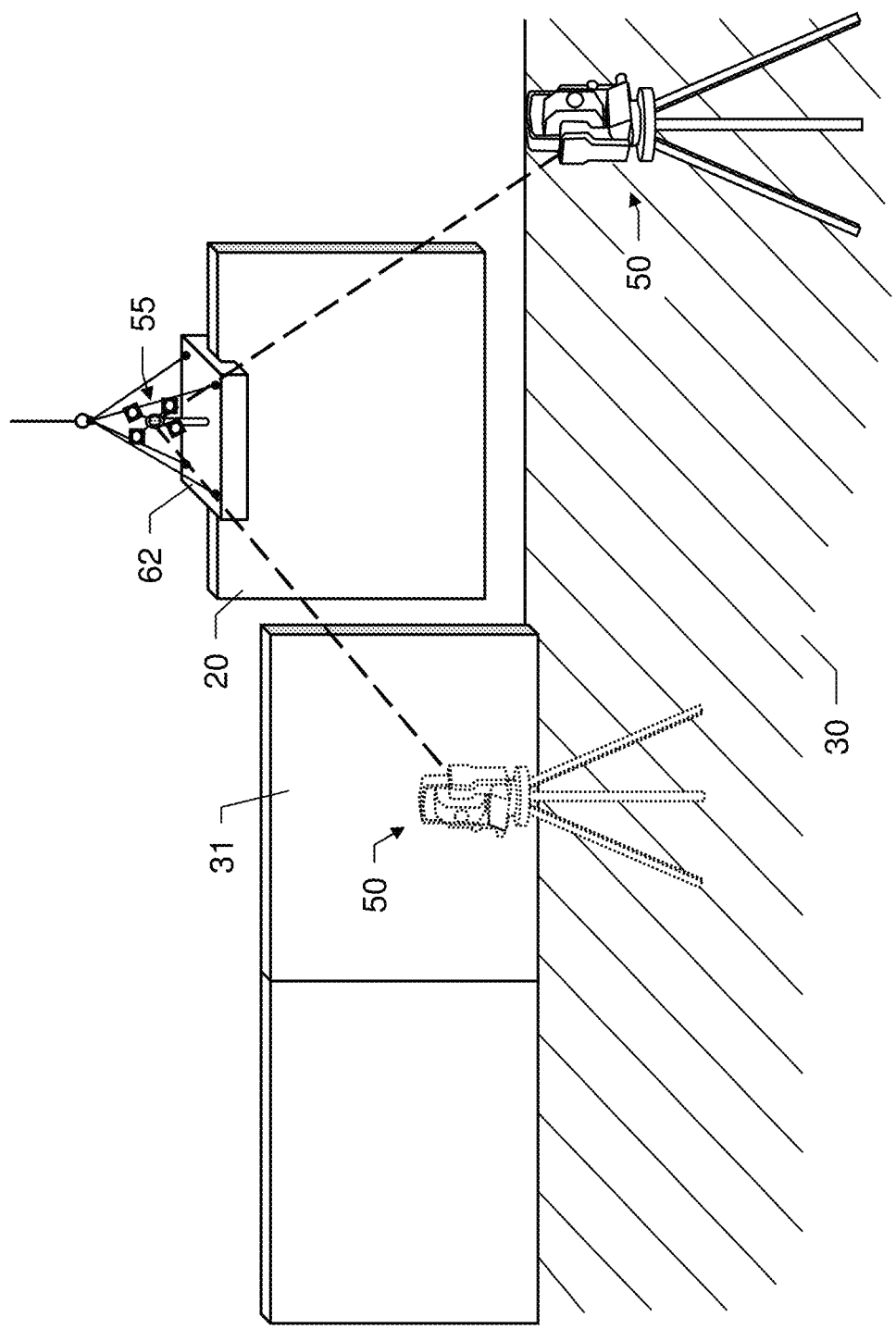

In FIG. 7, the surveying devices 50 comprise a camera, and a retroreflector is provided on the gear 62 as a part of a measuring aid 55 that comprises features which are arranged and identifiable in an image of the cameras to allow determining an orientation of the measuring aid 55 and thus of the gear 62 and the element 20 in three rotational degrees of freedom. For determining the pose of the element in this manner, one surveying device 50 is sufficient. Optionally, the at least one surveying device 50 is adapted as a laser tracker providing a tracking functionality for tracking the retroreflector and a camera for determining the orientation of the measuring aid 55.

Alternatively or additionally, an articulated arm CMM can be provided to measure the pose of the element directly at the mounting position 32 with high precision. It can be provided on the building 30, positioned on a base of the CMM near the mounting position 32. A first end of an articulated arm is connected to the base, and a second end connects to a predetermined point of the element 20. The CMM may comprise a probe, in particular a tactile probe, for measuring a position of a point relative to the base. Thus the probe, by touching the predetermined point of the element 20 with a probe, can determine the relative position of said point. Optionally, the probe is adapted to determine an orientation of a surface at the point, thus allowing determining a relative orientation of the element 20 (6dof probe). Alternatively, the CMM can be provided on the element 20 or on the gear 62, likewise touching a predetermined point of the building 30. Optionally, two or more CMM can be used for determining positions of two or more points, thus allowing determining an orientation.

Preferably, the second end of the articulated arm is fixedly attached to the point until the element is mounted 20. A connector can be positioned at the predetermined point that is adapted to connect to the arm. Alternatively, the arm can be adapted to connect to a feature or a surface of the element 20.

The probe or the second end of the arm can be attached manually. Alternatively, if the articulated arm can be actuated by means of a motor, by means of the surveying devices 50, the element 20 and/or the arm can be guided so that touching the point with the probe or arm end and establishing the connection can occur automatically.

Figure 8:
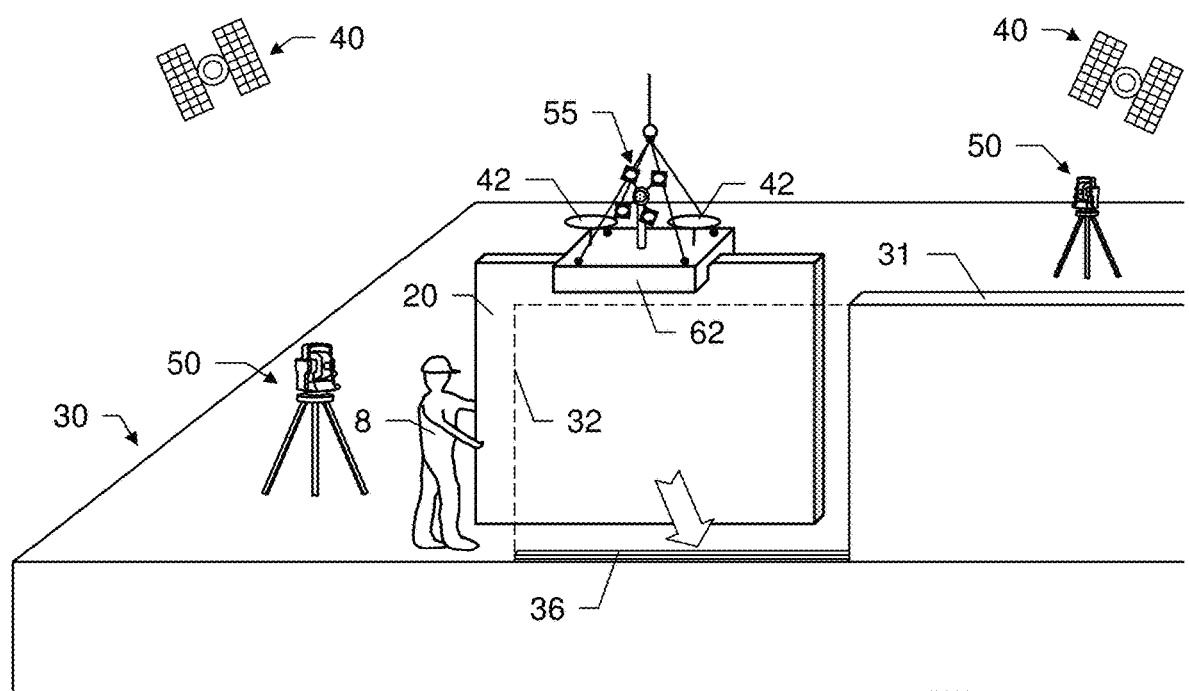
FIG. 8 illustrates a positioning the wall element at the mounting position.

FIG. 8 shows the positioning of the element 20 at the mounting position 32, where a worker 8 mounts the element 20 next to an existing element 31 on provided fixings 36. The pose determining unit in this embodiment comprises GNSS antennas 42 that are installed on the crane gear 62 and adapted to determine a pose of the element 20 by using position data obtained by means of a GNSS 40. The pose determining unit further comprises two surveying devices 50 (e.g. laser trackers) that are placed on the building 30 and adapted to determine a 6dof-pose of the element 20 by measuring a distance to a retroreflector of a measuring aid 55 that is installed on the crane gear 62 and by detecting the features of the measuring aid 55 in an image of a camera of the surveying devices 50.

The pose of the element 20 needs to be determined with a higher accuracy than a mounting tolerance for the element 20 at the mounting position 32. A typical mounting tolerance is e.g. two millimetres per metre. At least one surveying device 50 is therefore preferably positioned not too far away from the mounting position 32 and adapted to determine the pose with sufficient accuracy (e.g. in the sub-millimetre range). Such a surveying device might also be adapted as an articulated arm coordinate measuring machine that is positioned at the mounting position 32.

While being craned, the element 20 may not be in a surveying area of the surveying devices 50 all the time, i.e. positioned so that the measuring aid 55 can be seen by the surveying devices 50, so that a pose of the element 20 cannot be determined by means of the surveying devices 50 throughout the complete craning operation. Thus, the GNSS antennas 42 can provide a position and optionally also an orientation while the element 20 and the measuring aid 55 are outside said surveying area.

As a three-dimensional model of an actual construction state of the building 30 is available and the positions of the surveying devices 50 are known, it is possible to determine the borders of the surveying area. Using the position provided by the GNSS antennas 42 it is thus possible to generate movement instructions for guiding the element 20 into the surveying area.

A position and orientation of the element 20 needs to be determined with high precision and in six degrees of freedom only when the element 20 has almost reached its determined mounting position 32 (or mounting pose). Therefore, the position and orientation of the element 20 optionally can be determined with increasing accuracy as the element approaches the mounting position 32.

Also, while the element 20 is still far away from the mounting position 32, for generating the movement instructions it is possible to determine only the position of the element 20—or the position and less than three rotational degrees of freedom. In this case, a highly precise 6dof-measurement of the element's pose can be started e.g. when a determined distance of the element 20 falls below a threshold value.

Optionally, the movement instructions can be provided to workers 8 at the mounting position together with information about the exact mounting pose and/or the determined position and orientation of the element 20, in order to facilitate moving the element 20 into the exact mounting pose manually.

Figure 9:
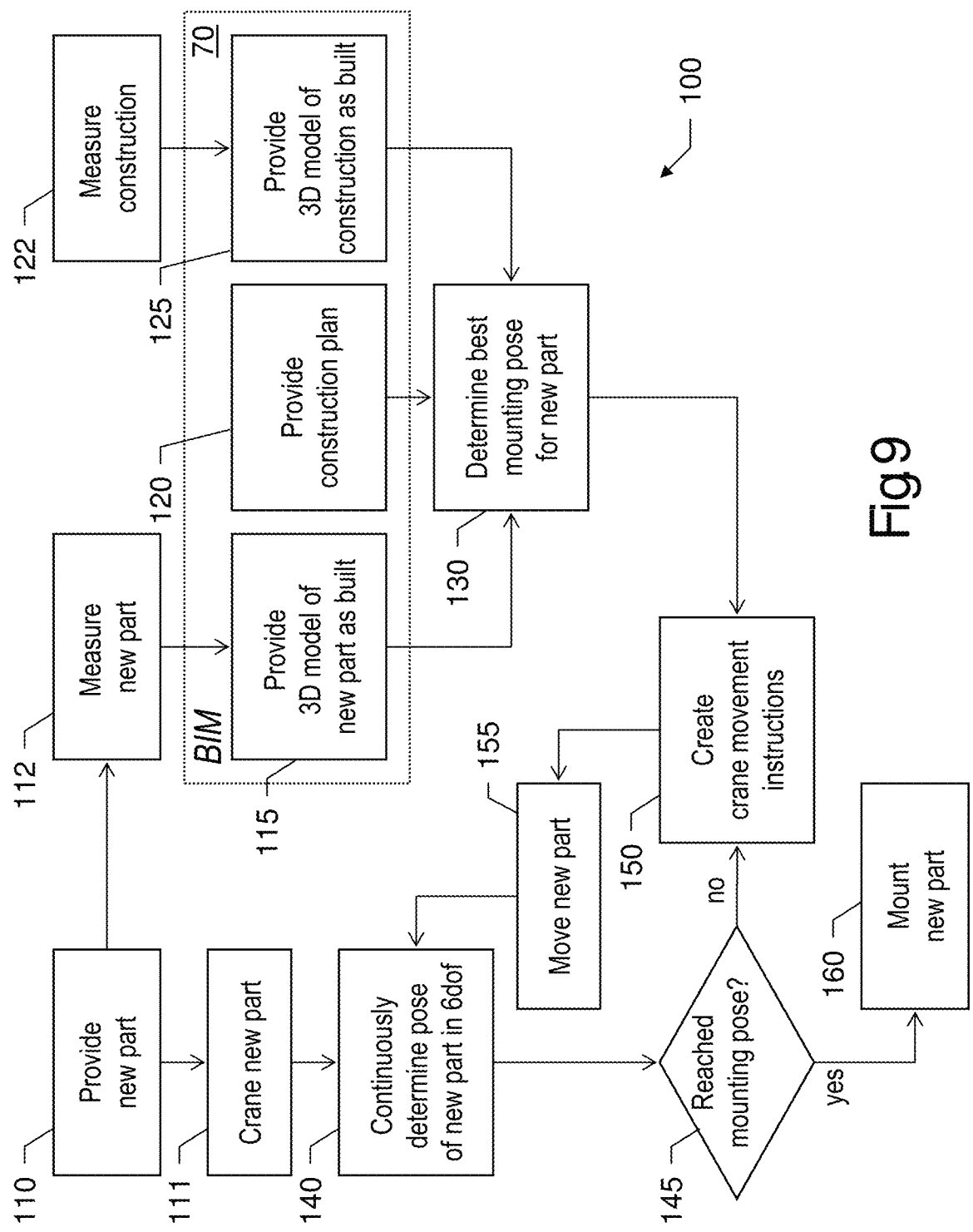
FIG. 9 shows a flowchart illustrating an exemplary embodiment of a method according to the invention.

FIG. 9 is a flow chart illustrating a method 100 according to the invention. In a first step 110 a new part to be mounted to a construction is provided. It is then measured 112, e.g. by means of a laser scanner, so that a 3D as-built model of the part is provided 115 as a part of a building information model (BIM) 70. Likewise, the construction is measured 122, in particular by means of one or more laser scanners. A 3D as-built model of the construction is then provided 125 as a part of the BIM 70. As a part of the BIM 70 also a construction plan is provided 120, comprising a target state of the construction. Using the information provided by the BIM 70, i.e. the construction plan and the 3D as-built models of the construction and the new part, the best mounting pose for the new part is determined 130. The best mounting pose comprises a mounting position and mounting orientation of the part in six degrees of freedom at which the part is to be mounted to the existing construction, in view of the original plan and the as-built state.

The new part is then craned 111, i.e. attached to a crane and lifted by the crane, suspended from a boom of the crane, wherein the crane is positioned and adapted to move the part to the mounting pose determined in step 130.

In step 140 the pose of the part is then determined continuously in six degrees of freedom while the part is craned and moved towards said mounting position. The pose is determined relative to the mounting position. This is done either directly, e.g. in such a way that the mounting position marks the point of origin of a common local coordinate system, or indirectly, e.g. in such a way that the pose and the mounting position, both, are assigned coordinates in a global or local coordinate system.

The pose of the part is compared with the mounting pose in step 145. If the poses are identical, the new part is mounted 160 to the building. If they are not identical, crane movement instructions are created 150 based on the mounting pose determined in step 130 and on the continuously determined pose of the part of step 140. This creation 150 of movement instructions occurs in real time and without more delay from the pose detection 140 of the part than technically necessary.

The crane is then moved 155 according to the crane movement instructions, thus changing the pose of the craned part, which is then determined again is step 140. The crane can be moved automatically based on the movement instructions, or the movement instructions are provided to a human operator of the crane, e.g. visually on a screen.

This loop is continued until the poses are determined to be identical in step 145 and the part is mounted 160. Additionally, the movement instructions can be provided to workers mounting the element, in order to allow them to move the element into the mounting position manually with high precision.

Although the invention is illustrated above, partly with reference to some preferred embodiments, it must be understood that numerous modifications and combinations of different features of the embodiments can be made. All of these modifications lie within the scope of the appended claims.

What is claimed is:

1. A construction management system for constructing a building by using at least one heavy lifting machine for moving at least one building element to a mounting position on the building, the system comprising:
   a central computing unit with a calculation means and a data storage, the central computing unit providing a building information model including:
      a construction plan comprising a target state of the construction of the building,
      a three-dimensional model of an actual construction state of the building, and
      a three-dimensional model of the building element,
   wherein the central computing unit is adapted to:

determine the mounting position for the building element based on the construction plan, on the model of the current construction state and on the model of the building element, and define a threshold distance value, wherein the threshold distance value is also depending on the size of the element;

a machine controlling unit adapted to generate movement information to move the building element to the mounting position by means of the at least one lifting machine; and a pose determining unit adapted to:

monitor a distance of the element to the mounting position only when the distance is below the pre-defined threshold distance value, determine, in real time and in six degrees of freedom, a position and orientation of the building element while it is lifted by the lifting machine, generate pose data based on the determined position and orientation of the building element, and provide the pose data to the machine controlling unit in real time, wherein the machine controlling unit is adapted to generate the movement information in real time based on the pose data.

2. The construction management system according to claim 1, wherein the central computing unit is adapted to determine a mounting pose of the building element based on the construction plan, on the model of the current construction state and on the model of the building element, the mounting pose comprising the mounting position and a mounting orientation.

3. The construction management system according to claim 2, wherein the pose determining unit comprises at least one articulated arm coordinate measuring machine adapted to determine, at the mounting position:

a position of the building element relative to the mounting position and an orientation of the building element relative to the mounting orientation.

4. The construction management system according to claim 1, wherein the central computing unit is adapted to determine a movement path from a determined position of the building element to the mounting position, and the movement information comprises movement instructions for moving the building element along the movement path, wherein the machine controlling unit:

is adapted to automatically control the lifting machine based on the movement instructions, or comprises a display and is adapted to visually provide the movement instructions to an operator of the lifting machine.

5. The construction management system according to claim 1, wherein the machine controlling unit is adapted to provide the movement information to a user at the mounting position.

6. The construction management system according to claim 1, further comprising:

survey instruments adapted to provide:

the three-dimensional model of the actual construction state of the building, or the three-dimensional model of the building element.

7. The construction management system according to claim 1, wherein the pose determining unit comprises:

at least one movable GNSS device attachable to the building element or to a first part of the lifting machine to which the building element is fixed during lifting providing first GNSS data indicating a position of the respective GNSS device.

8. The construction management system according to claim 1, wherein the pose determining unit:

comprises at least one stationary GNSS device providing stationary GNSS data, and is adapted to determine at least the position of the building element based on the first GNSS data and on the stationary GNSS data.

9. The construction management system according to claim 1, wherein the pose determining unit comprises:

at least one surveying device being adapted to determine, in three positional degrees of freedom, a position of a retroreflector that is attached to the building element or to a first part of the lifting machine to which the building element is fixed during craning, providing surveying data indicating the position and orientation of the building element.

10. A method for positioning a building element at a mounting position of a building by means of a heavy lifting machine, the method comprising:

providing a building information model comprising at least:

a construction plan comprising a target state of the construction of the building, a three-dimensional model of a current construction state of the building, and a three-dimensional model of the building element;

determining the mounting position for the building element based on the construction plan, on the model of the current construction state, and on the model of the building element;

defining a threshold distance value, wherein the threshold distance value also depends on the size of the element;

lifting the building element by means of the lifting machine;

monitoring a distance of the element to the mounting position;

determining, only when the distance is below the pre-defined threshold distance value, in real time while the building element is being lifted and in six degrees of freedom, a position and orientation of the building element;

generating pose data based on the determined position and orientation of the building element;

generating movement information in real time based on the pose data; and moving, by means of the lifting machine, the building element to the mounting position according to the movement information.

11. The method according to claim 10, wherein determining the mounting position comprises predicting dimensional changes of the element or of fittings for connecting the building element to the building, said changes occurring during moving the building element or after mounting the building element.

12. The method according to claim 10, wherein the position and orientation of the building element is determined with increasing accuracy as the element approaches the mounting position.

13. The method according to claim 10, wherein determining the position and orientation of the building element comprises determining by means of at least one surveying device a position of a retroreflector that is attached to the building element or to a first part of the lifting machine to which the building element is fixed during lifting.

14. The method according to claim 13, wherein the at least one surveying device has a surveying area in which the position and orientation of the element is determinable, wherein the method comprises moving the building element into the surveying area.

15. A computer programme product comprising programme code which is stored on a non-transitory machine-readable storage medium and having computer-executable instructions for performing:
monitoring a distance of the element to the mounting position;
determining, only when the distance is below a predefined threshold distance value, the threshold distance value also depending on the size of the element, in real time and in six degrees of freedom, a position and orientation of a building element while it is lifted;
generating pose data based on the determined position and orientation of the building element; and
generating movement information in real time based on the pose data.

\* \* \* \* \*